US006485534B2

(12) United States Patent
Quill

(10) Patent No.: US 6,485,534 B2
(45) Date of Patent: Nov. 26, 2002

(54) CONTAMINANT COLLECTOR TRAP FOR ION IMPLANTER

(75) Inventor: James P. Quill, Wakefield, MA (US)

(73) Assignee: Axcellis Technologies, Inc., Beverly, MA (US)

(*) Notice: Subject to any disclaimer, the term of this patent is extended or adjusted under 35 U.S.C. 154(b) by 100 days.

(21) Appl. No.: 09/742,910

(22) Filed: Dec. 20, 2000

(65) Prior Publication Data

US 2002/0074509 A1 Jun. 20, 2002

(51) Int. Cl.[7] .......................... B01D 45/12; B01D 50/00

(52) U.S. Cl. ............................ 55/315; 55/318; 55/414; 55/459.1; 55/459.5; 55/430; 55/435; 55/444

(58) Field of Search ....................... 55/315, 318, 385.2, 55/413, 414, 430, 431, 459.1, 459.5, 466, 435, 444

(56) References Cited

U.S. PATENT DOCUMENTS 2,757,581 A * 8/1956 Freeman et al. ............ 209/730
4,214,853 A 7/1980 Mahl .......................... 417/154
4,260,401 A * 4/1981 Truhan et al. ................ 55/339
4,534,861 A 8/1985 Wedemeyer et al. ........ 210/168
4,572,726 A * 2/1986 Van Abbema .............. 406/109
5,289,641 A 3/1994 Balamuta et al. .............. 34/75
5,312,245 A 5/1994 Brannen et al. .............. 432/95
5,312,466 A * 5/1994 Taberlet et al. ............... 55/429

* cited by examiner

*Primary Examiner*—Robert A. Hopkins
(74) *Attorney, Agent, or Firm*—Eschweiler & Associates, LLC

(57) ABSTRACT

An evacuation system for a chamber (14) is provided, including a pump (12) for removing gases and contaminants from the chamber. The pump has an outlet (32) connected to an exhaust duct (34). A collector trap (42) for use in collecting contaminants evacuated from the chamber is positioned between the pump outlet (32) and the exhaust duct (34). The collector trap (42) comprises: (i) a gas/contaminant separator (46) having an inlet (56) for introducing gases and contaminants therein, the separator (46) functioning to physically separate the gases and contaminants; (ii) a contaminant collector (48) for collecting the separated contaminants, the collector (48) including an extractor coupling (70) for allowing extraction of the contaminants from the collector; and (iii) an outlet (72) for allowing the separated gases to exit the gas/contaminant separator (46) and into the exhaust duct (34).

13 Claims, 4 Drawing Sheets

CONTAMINANT COLLECTOR TRAP FOR ION IMPLANTER

FIELD OF THE INVENTION

The present invention relates generally to ion implanters, and more specifically to a contaminant collector trap for such ion implanters.

BACKGROUND OF THE INVENTION

Conventional ion implantation systems, used for doping workpieces such as semiconductors, typically include an ion source that ionizes a desired dopant element that is then accelerated to form an ion beam of prescribed energy. The ion beam is directed at the surface of the workpiece to implant the workpiece with the dopant element. The energetic (generally positive) ions of the ion beam penetrate the surface of the workpiece so that they are embedded into the crystalline lattice of the workpiece material to form a region of desired conductivity. The implantation process is typically performed in a high-vacuum process chamber which prevents dispersion of the ion beam by collisions with residual gas molecules and which minimizes the risk of contamination of the workpiece by airborne particulates. Other portions of the ion implanter, including the ion beamline through which the ion beam passes, are also evacuated.

High-powered turbo pumps or roughing pumps typically provide the required vacuum conditions in ion implantation systems. As shown in the prior art system 10 of FIG. 1, such systems often include a roughing pump 12 for evacuating a chamber defined by the ion implanter terminal 14, which contains a high voltage gas box 16, an ion source 18 and a mass 20 analysis magnet 20. As is known in the art, gas provided by the gas box 16 is ionized in the ion source 18 and extracted in the form of an ion beam 22. The ion beam 22 is mass analyzed by the mass analysis magnet 20 and output from the terminal 14 through terminal aperture 24.

The high voltage gas box 16, which typically operates at a voltage significantly higher than the terminal voltage, is electrically isolated from the terminal 14 by insulators 26. The terminal is electrically isolated from an implanter enclosure 28 by insulators 30. The implanter enclosure 28 is situated at electrical ground potential.

The roughing pump 12 evacuates the interior of the terminal 14 via an inlet (not shown or designated), and outputs any evacuated gases, liquids or particulates via its insulated outlet 32 into the terminal main exhaust duct 34. In addition, the exhaust duct 34, which is electrically grounded along with the implanter enclosure 28, is used to vent the high voltage gas box 16 to the external environment. As such, the exhaust duct includes an insulative (e.g., plastic) extension 36 that connects the gas box 16 to the implanter enclosure 28 through the terminal 14.

A problem with the pump evacuation system shown in FIG. 1 is that gaseous matter pumped out of the terminal passes through phase changes caused by temperature loss and tends to condense on the walls of the exhaust duct 34 above the terminal. In addition, toxic fumes evacuated by pump 12 react with the cooler extraction flow in the terminal exhaust duct 34 to form an acidic liquid (e.g., hydrofluoric (HF) and phosphoric (PF) acids). Over time, these liquids accumulate until the quantity is sufficient to sublimate tracking down the plastic extension 36 by what could be described as a capillary pumping action. The liquid provides a conductive path between portions of the implanter residing at significantly different voltages, thereby presenting a risk of arcing or other electrical discharge through the extension 36. In addition, the liquid may corrode the gas box 16.

One solution to this problem is to provide additional heated gas (e.g., nitrogen or air) into the inlet or outlet of the pump to keep the corrosive contaminants suspended in the exhaust gases to thereby prevent condensation of these acidic liquids. However, such additional gases reduce the efficiency of the pump and may cause it to shut down if appropriate pump pressure sensors indicate an overpressure condition.

Another solution is to provide a filter trap or water-cooled collector in the exhaust duct 34 for trapping or collecting the liquids condensing therein. However, the addition of such traps or collectors reduces the exhaust gas flow through the exhaust duct 34 and may again cause the pump to shut down if an overpressure condition is indicated by appropriate pump pressure sensors.

It is an object of the present invention, then, to provide a mechanism for separating liquids and gases which are evacuated from a chamber by a pump. It is a further object of the invention to provide a mechanism for evacuating a chamber by a pump wherein the risk of electrical discharge or arcing is minimized. It is yet a further object of the present invention to provide a pumping system wherein condensing liquids are prevented from posing the risk of corrosion or electrical discharge. It is a still a further object of the invention to provide an easily maintainable system for removing evacuated liquids in a vacuum system.

SUMMARY OF THE INVENTION

An evacuation system for a chamber is provided, including a pump for removing gases and contaminants from the chamber. The pump has an outlet connected to an exhaust duct. A collector trap for use in collecting contaminants evacuated from the chamber is positioned between the pump outlet and the exhaust duct. The collector trap comprises: (i) a gas/contaminant separator having an inlet for introducing gases and contaminants therein, the separator functioning to physically separate the gases and contaminants; (ii) a contaminant collector for collecting the separated contaminants, the collector including an extractor coupling for allowing extraction of the contaminants from the collector; and (iii) an outlet for allowing the separated gases to exit the gas/contaminant separator and into the exhaust duct.

DETAILED DESCRIPTION OF A PREFERRED EMBODIMENT OF THE INVENTION

Figure 1:
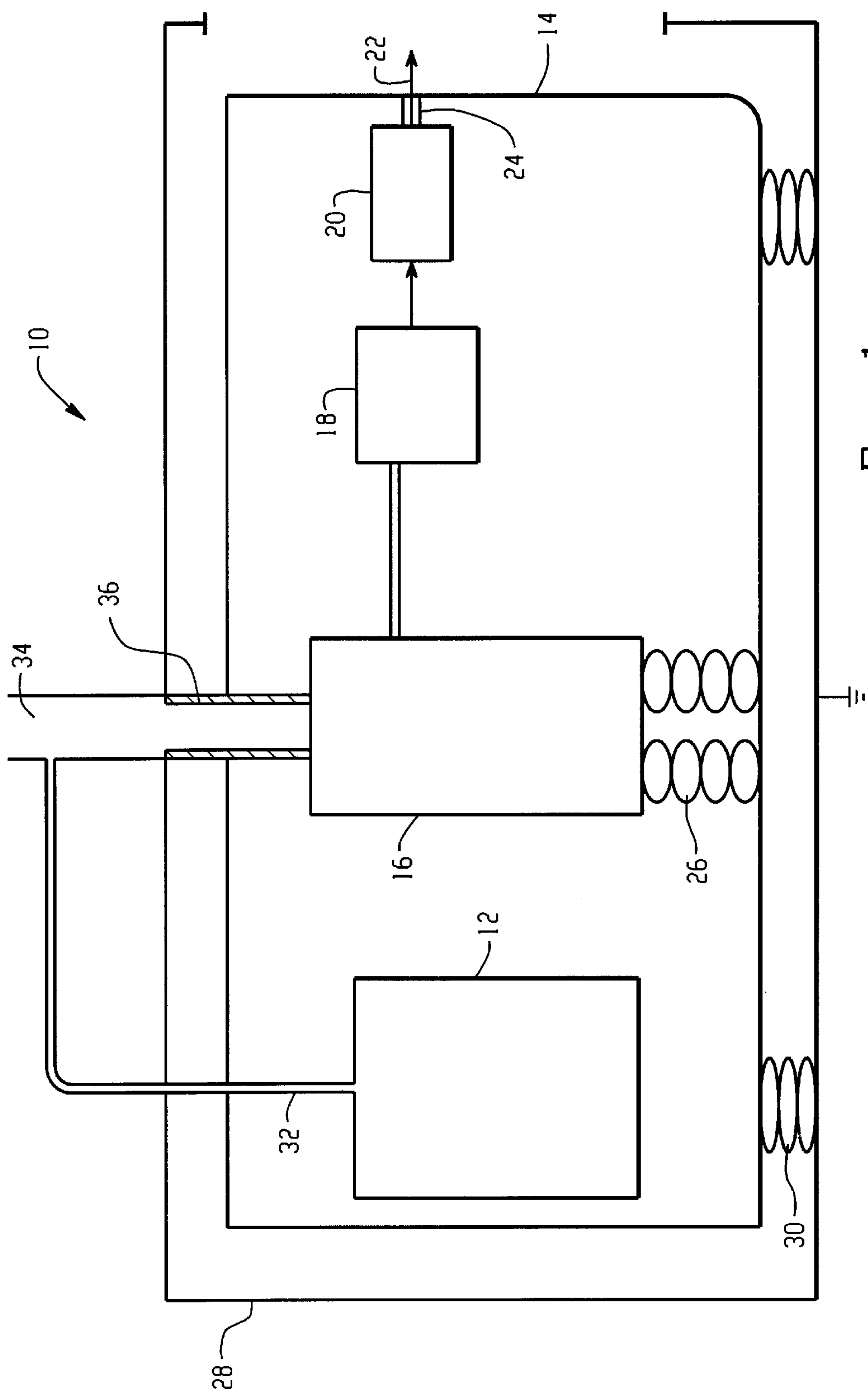
FIG. 1 is a system diagram of a prior art ion implanter including means for pumping out a chamber thereof.

Referring now to FIG. 1 of the drawings, a front-end portion of an ion implantation system 40 is shown. Components of the ion implantation system 40 that are common with and identical to components of the ion implantation system 10 of Figure are provided with identical reference numbers.

The present invention is implemented as a contaminant trap 42 and an optional filter 44. Both the trap 42 and the filter 44 are positioned in line with the pump outlet 32, intermediate the pump and the exhaust duct 34. The trap 42 comprises a gas/contaminant separator 46 and a contaminant collector 48. Standard couplings (e.g., flanges) 50, 52 and 54 are provided to facilitate installation of the trap 42 and the filter 44 in line with the pump outlet 32.

In operation, gases, liquids and particulates are removed from the terminal 14 by pump 12 via its outlet 36. The contaminant trap 42 physically separates the lighter gases from the heavier contaminants (i.e., liquids and particulates), allowing the separated contaminants to settle into the contaminant collector 48, and the separated gases to continue through the optional filter 44 and on into the exhaust duct 34.

Figure 3:
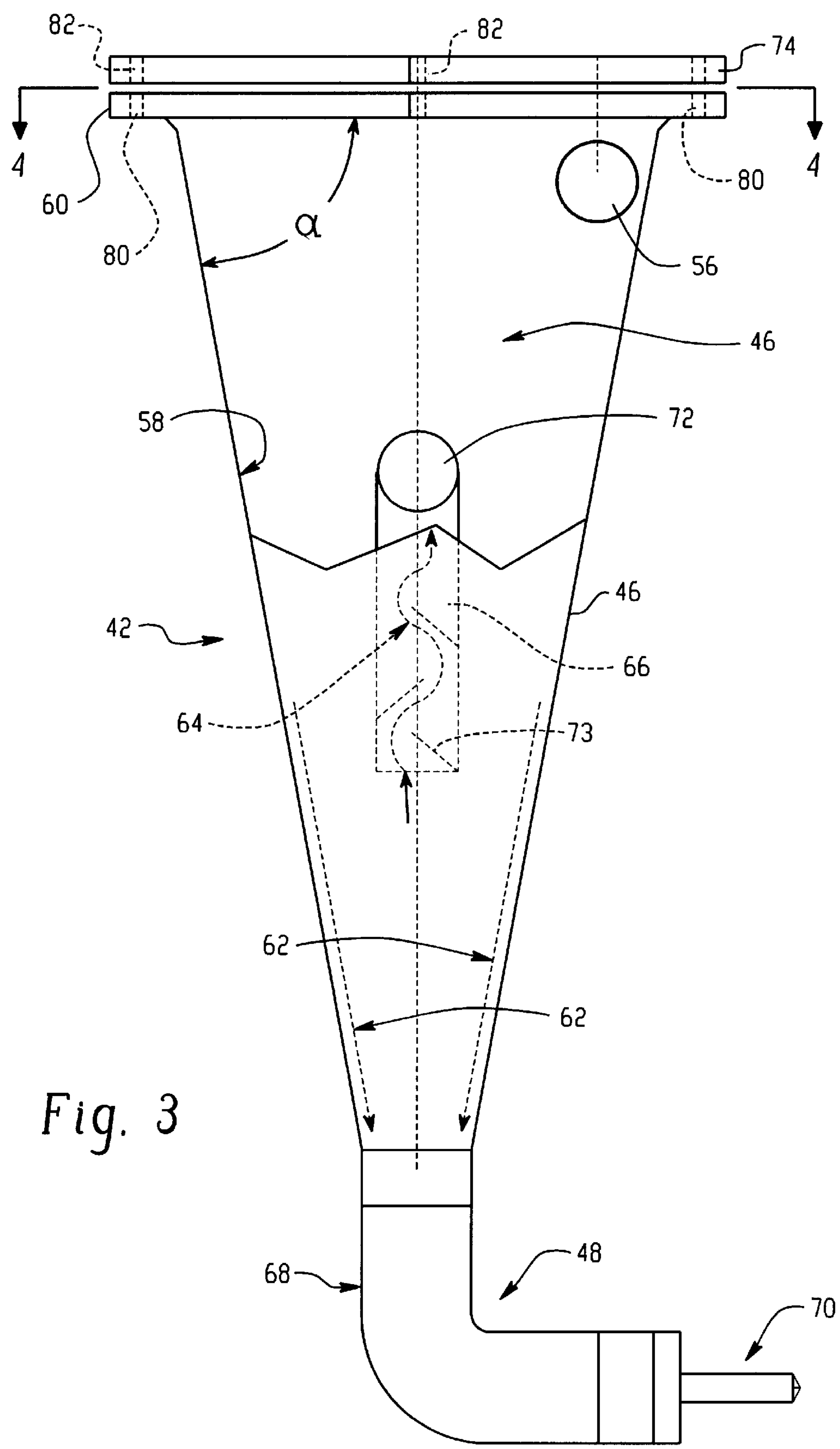
FIG. 3 is a more detailed view of the contaminant collector trap shown in FIG. 2.

The contaminant trap 42 is shown in more detail in FIG. 3. Gases, liquids, and particulates flow into the gas/contaminant separator 46 via inlet 56, and spiral in a downward direction, confined by the frustoconical walls 58. The walls and a top flange 60 form an angle α that increases the cyclonic effect provided by the gas/contaminant separator 46. In the disclosed preferred embodiment, the angle α is on the order of 80°.

The cyclonic effect provided by the gas/contaminant separator 46 separates the contaminants (i.e., liquids and particulates) from gases. The separated contaminants flow downward in directions represented by dashed lines 62, while the gases flow upward in a direction represented by dashed lines 64. The separated contaminants settle into contaminant collector 48, or collect on the sloped walls 58 of the separator 46, whereby gravity will act thereupon and cause the contaminants to eventually settle into the collector 48. The gases flow upward into an optical baffle 66, the operation of which will be further explained below.

With regard to the separated contaminants, the contaminant collector 48 includes a transparent (e.g., glass or plastic) elbow portion 68 through which the collected contaminants may be viewed. At regular intervals, or more frequently depending upon the amount of contaminants collected, the elbow portion 68 may be emptied by a wet/dry vacuum connected to vacuum extractor coupling 70. As such, the contaminants may be removed without the risk of human contact. Because the collected contaminants reside in the elbow portion 68, they do not impede the gas/contaminant flow from the pump outlet 32 to the exhaust duct 34. Thus, the risk of pump pressure sensors shutting down the pump 12 is greatly reduced as compared to the prior art system 10 of FIG. 1.

The optical baffle 66 provides the mechanism by which separated gases flow from the gas/contaminant separator 46 to the exhaust duct 34 via baffle outlet 72. The optical baffle 66 in the disclosed embodiment is generally cylindrical in shape and is provided with partially overlapping baffle fins 73 extending inwardly. The fins 73 function to trap contaminants that might not settle into the contaminant collector 48. The inner surfaces of the optical baffle 66 and the fins 73 may be covered with a temperature-bonded coating of a non-stick (e.g., Teflon®) material. Such a material may be applied in sufficient thickness to provide a low-friction surface that will enhance the downward movement of collected contaminants into the collector 48.

Figure 4:
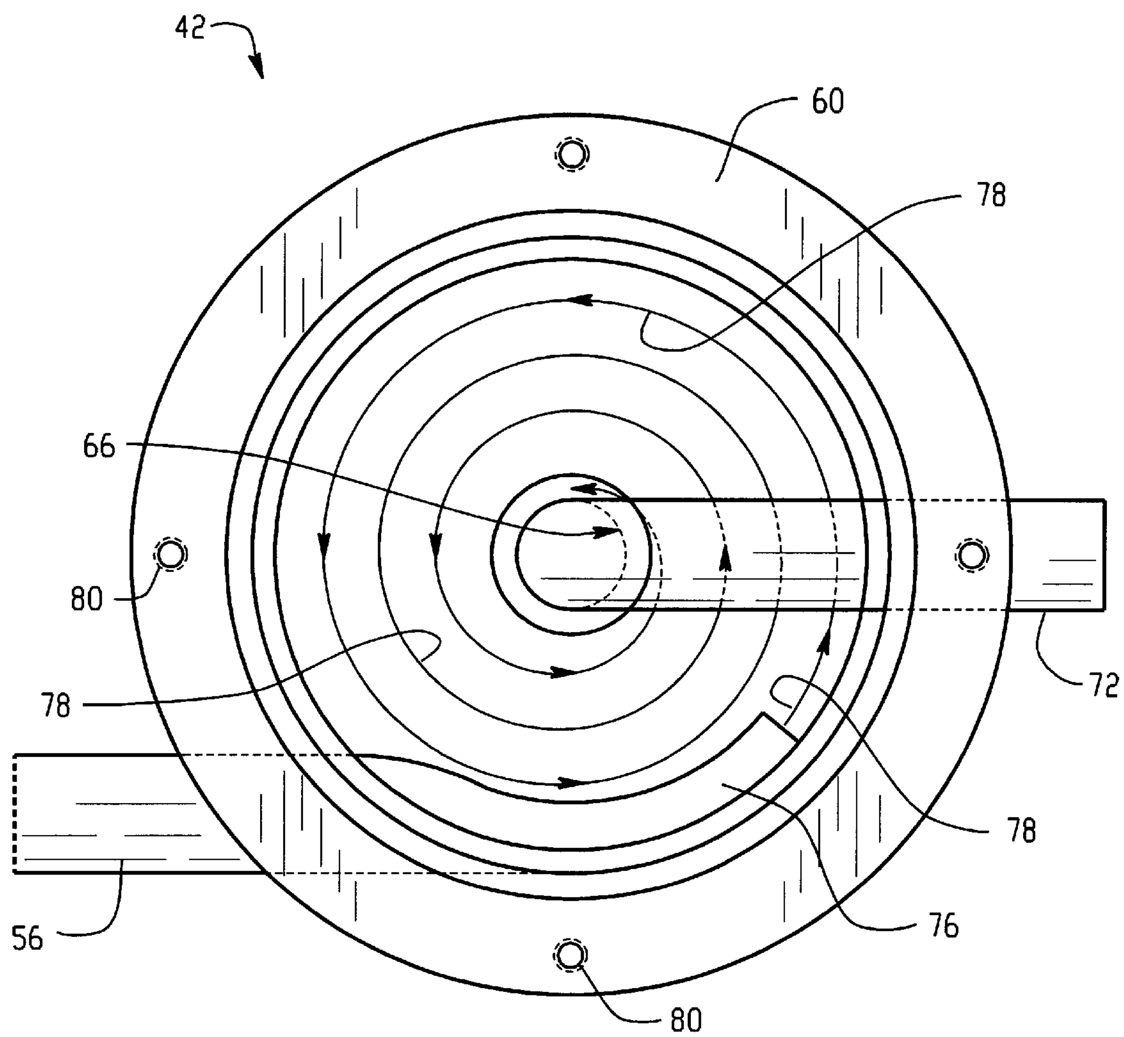
FIG. 4 is an end view of the contaminant collector trap of FIG. 3, taken along the line 4—4.

FIG. 4 shows the contaminant trap 42 of FIG. 3 taken along the lines 4—4, without clean-out cap 74. The separator inlet 56 concludes in a tapered section 76 as it enters the separator 46. The cyclonic effect on the gases and contaminants entering the separator 46 are represented by continuous spiral line 78. The flange 60 is provided with fastener holes 80 that align with similar holes 82 in the clean-out cap 74 (refer back to FIG. 3). The clean-out cap may be removed so that the separator 46 may be cleaned on a periodic basis.

Figure 2:
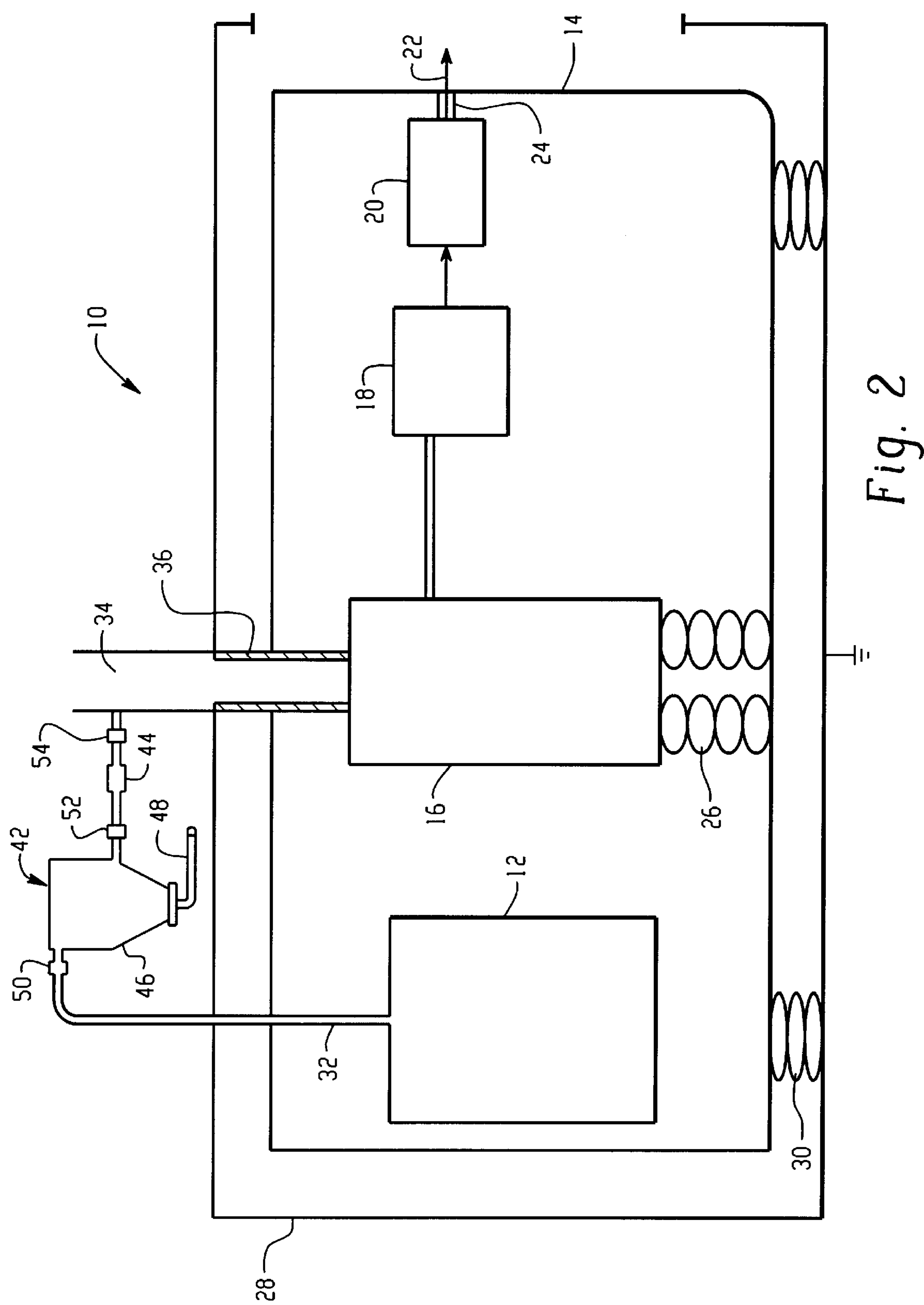
FIG. 2 is a system diagram of an ion implanter into which is incorporated the ontaminant collector trap of the present invention.

Referring back to FIG. 2, the optional filter 44 is positioned between the separator baffle outlet 70 and the exhaust duct 34. The filter may be installed in this location to filter out any contaminants that are not collected by the contaminant trap 42. In the disclosed embodiment, the filter 44 is a commercially available filter such as Visitrap, available from MV Products, North Billerica, Mass. It is intended to use the filter 44 in connection with the contaminant trap 42, but not in place of it. Using only the filter 44 might cause the pump 16 to shut down if clogged filter conditions cause appropriate pump pressure sensors to indicate an overpressure condition.

Accordingly, a preferred embodiment of a contaminant collector trap for an ion implanter has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A collector trap for use in collecting contaminants evacuated from an evacuated chamber, comprising:

(i) a gas/contaminant separator having an inlet for introducing gases and contaminants therein, said separator functioning to physically separate the gases and contaminants;

(ii) a contaminant collector for collecting the separated contaminants, said collector including an extractor coupling for allowing extraction of the contaminants from the collector; and (iii) an outlet for allowing the separated gases to exit the gas/contaminant separator, the outlet comprising an optical baffle for collecting contaminants that are not physically separated from the gases by the gas/contaminant separator, the optical baffle comprising partially overlapping fins extending inwardly therefrom.

2. The collector trap of claim 1, wherein said contaminant collector includes a transparent portion for viewing the contaminants therein.

3. The collector trap of claim 1, wherein said partially overlapping fins are covered with a temperature-bonded coating of a non-stick material.

4. The collector trap of claim 1, wherein said gas/contaminant separator is generally frustoconical in shape.

5. The collector trap of claim 1, wherein said inlet includes a tapered portion.

6. The collector trap of claim 1, wherein the contaminants include liquids and particulates.

7. An evacuation system for a chamber, comprising:

(i) a pump for removing gases and contaminants from the chamber, said pump having an outlet connected to an exhaust duct; and (ii) a collector trap for use in collecting contaminants evacuated from an evacuated chamber, the collector trap positioned between the pump outlet and the exhaust duct and comprising: a gas/contaminant separator having an inlet for introducing gases and contaminants therein, said separator functioning to physically separate the gases and contaminants; a contaminant collector for collecting the separated contaminants, said collector including an extractor coupling for allowing extraction of the contaminants from the collector; and an outlet for allowing the separated gases to exit the gas/contaminant separator, the outlet comprising an optical baffle for collecting contaminants that are not physically separated from the gasses be the gas/contaminant separator, the optical baffle comprising partially overlapping fins extending inwardly therefrom.

8. The evacuation system of claim 7, wherein said contaminant collector includes a transparent portion for viewing the contaminants therein.

9. The evacuation system of claim 7, wherein the fins are covered with a temperature-bonded coating of a non-stick material.

10. The evacuation system of claim 7, wherein said gas/contaminant separator is generally frustoconical in shape.

11. The evacuation system of claim 7, wherein said inlet includes a tapered portion.

12. The evacuation system of claim 7, wherein the contaminants include liquids and particulates.

13. The evacuation system of claim 7, further comprising a filter disposed between the collector trap and the exhaust duct.

* * * * *